US 10,868,100 B2

(12) United States Patent
Ma et al.

(10) Patent No.: US 10,868,100 B2
(45) Date of Patent: Dec. 15, 2020

(54) DISPLAY PANEL AND DISPLAY DEVICE

(71) Applicant: WUHAN TIANMA MICRO-ELECTRONICS CO., LTD., Wuhan (CN)

(72) Inventors: Yangzhao Ma, Wuhan (CN); Tianqing Hu, Shanghai (CN); Zhaokeng Cao, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 13 days.

(21) Appl. No.: 16/229,809

(22) Filed: Dec. 21, 2018

(65) Prior Publication Data

US 2020/0135832 A1    Apr. 30, 2020

(30) Foreign Application Priority Data

Oct. 30, 2018  (CN) .......................... 2018 1 1275133

(51) Int. Cl.
*H01L 27/32*    (2006.01)
*G09G 3/3225*   (2016.01)
*H01L 27/148*   (2006.01)
*G09G 3/3275*   (2016.01)

(52) U.S. Cl.
CPC ....... *H01L 27/3276* (2013.01); *G09G 3/3225* (2013.01); *H01L 27/14812* (2013.01); *G09G 2310/0286* (2013.01)

(58) Field of Classification Search
CPC .. G09G 3/2092; G09G 3/3233; G09G 3/3258; G06F 1/1637; G06F 1/1626
See application file for complete search history.

(56) References Cited

U.S. PATENT DOCUMENTS

| 10,546,527 | B2 * | 1/2020 | Pyo | G09G 3/3225 |
| 2004/0239586 | A1 * | 12/2004 | Cok | G09G 3/3266 |
| | | | | 345/55 |
| 2013/0207946 | A1 * | 8/2013 | Kim | G09G 3/3225 |
| | | | | 345/204 |
| 2018/0137805 | A1 * | 5/2018 | Zheng | G09G 3/2092 |
| 2018/0158417 | A1 * | 6/2018 | Xiang | G09G 3/3233 |

(Continued)

FOREIGN PATENT DOCUMENTS

| CN | 107342036 A | 11/2017 |
| CN | 107346650 A | 11/2017 |
| CN | 107633807 A | 1/2018 |

*Primary Examiner* — Sepehr Azari
(74) *Attorney, Agent, or Firm* — Anova Law Group PLLC

(57) ABSTRACT

A display panel and a display device are provided. The display panel comprises a display area including a first display area and a second display area arranged in a row direction, and the first display area includes at least one notch; and a non-display area surrounding the display area. The non-display area includes a first non-display area and a second non-display area, and along the row direction, the first non-display area and the second non-display area are respectively disposed at two opposite sides of the display area. The first non-display area include a first driving circuit, which includes a plurality of cascaded first shift registers, and the second non-display area includes a second driving circuit, which includes a plurality of cascaded second shift registers. The display panel includes a first driving unit and a second driving unit.

19 Claims, 11 Drawing Sheets

(56) References Cited

U.S. PATENT DOCUMENTS

| | | | | |
|---|---|---|---|---|
| 2018/0196475 A1* | 7/2018 | Bao | ........................ | G06F 1/1637 |
| 2018/0307270 A1* | 10/2018 | Pantel | .................... | G06F 1/1626 |
| 2019/0164489 A1* | 5/2019 | Zhang | ................... | G09G 3/3258 |
| 2019/0304356 A1* | 10/2019 | Ka | ....................... | H01L 27/3223 |
| 2019/0363266 A1* | 11/2019 | Tanaka | ................ | H01L 51/5253 |

* cited by examiner

DISPLAY PANEL AND DISPLAY DEVICE

CROSS-REFERENCES TO RELATED APPLICATIONS

This application claims the priority of Chinese Patent Application No. CN201811275133.4, filed on Oct. 30, 2018, the entire contents of all of which are incorporated herein by reference.

FIELD OF THE DISCLOSURE

The present disclosure generally relates to the display technology and, more particularly, relates to a display panel and a display device thereof.

BACKGROUND

As electronic technology advances, manufacturing technology of display panels is continuing to mature. Existing display panels mainly include liquid crystal display panels, organic light-emitting display panels, and electronic-paper display panels, etc. To increase the screen size of the display device and realize a full-screen display, display devices with a narrow frame have gradually become a development trend.

Existing display devices, such as displays, televisions, mobile phones, tablets, etc., often have generally regular rectangular screens. With continuous development of display technology and diversified user demands on the appearance of display devices, simple rectangular display devices may not meet the consumer desires. Therefore, various shapes of display devices have emerged. In the existing technologies, the display device is often designed to have a shape other than a regular rectangle, and such a display device is named as an irregular-shaped display device.

The irregular-shaped display devices are able to diversify the screen of the display devices, thereby being applied to various products such as advertisement display screens, information indicating screens, vehicle screens, smart watches, smart bracelets, VR/AR glasses, etc., and having a large variety of applications. In addition, the irregular-shaped display devices are able to bypass some functional modules on the front panel of the display devices, such as a camera module, a sensor module or a speaker module, thereby improving the screen-to-body ratio of the display device and, accordingly, enhancing the display performance, and enabling a full-screen display.

Meanwhile, the research of flexible display (soft screen) technology is also constantly improving and deepening. Unlike traditional flat panel displays, the display panel can be folded and bent using a flexible materials as a substrate, thereby creating a dreamlike visual effect. Flexible display panels have a variety of application fields with their flexibility, such as rollable display devices, flexible wearable devices, and foldable displays, etc. How to continuously realize the extremely narrow frame of the display panel, achieve s full-screen display as much as possible, and make the display panel bendable are bottlenecks in the display industry and, meanwhile, the research direction of the display industry. The disclosed display panel and display device thereof are directed to solve one or more problems set forth above and other problems.

BRIEF SUMMARY OF THE DISCLOSURE

One aspect of the present disclosure provides a display panel. The display panel comprises a display area including a plurality of signal lines extending in a row direction and a plurality of data lines extending in a column direction, wherein the display area includes a first display area and a second display area, the first display area and the second display area are arranged in the row direction, and the first display area includes at least one notch; and a non-display area surrounding the display area, wherein the non-display area includes a first non-display area and a second non-display area, and along the row direction, the first non-display area and the second non-display area are respectively disposed at two opposite sides of the display area. The first non-display area include a first driving circuit, which includes a plurality of cascaded first shift registers, and the second non-display area includes a second driving circuit, which includes a plurality of cascaded second shift registers. The display panel includes a first driving unit and a second driving unit.

Another aspect of the present disclosure provides a display device. The display device comprises a display panel and a housing for accommodating the display panel. The display panel comprises a display area including a plurality of signal lines extending in a row direction and a plurality of data lines extending in a column direction, wherein the display area includes a first display area and a second display area, the first display area and the second display area are arranged in the row direction, and the first display area includes at least one notch; and a non-display area surrounding the display area, wherein the non-display area includes a first non-display area and a second non-display area, and along the row direction, the first non-display area and the second non-display area are respectively disposed at two opposite sides of the display area. The first non-display area include a first driving circuit, which includes a plurality of cascaded first shift registers, and the second non-display area includes a second driving circuit, which includes a plurality of cascaded second shift registers. The display panel includes a first driving unit and a second driving unit.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which may be illustrated in the accompanying drawings. Hereinafter, embodiments consistent with the disclosure will be described with reference to drawings. Wherever possible, the same reference numbers will be used throughout the drawings to refer to the same or like parts. It may be apparent that the described embodiments may be some but not all of the embodiments of the present disclosure. Based on the disclosed embodiments, persons of ordinary skill in the art may derive other embodiments consistent with the present disclosure, all of which may be within the scope of the present disclosure. Further, in the present disclosure, the disclosed embodiments and the features of the disclosed embodiments may be combined under conditions without conflicts.

Figure 1:
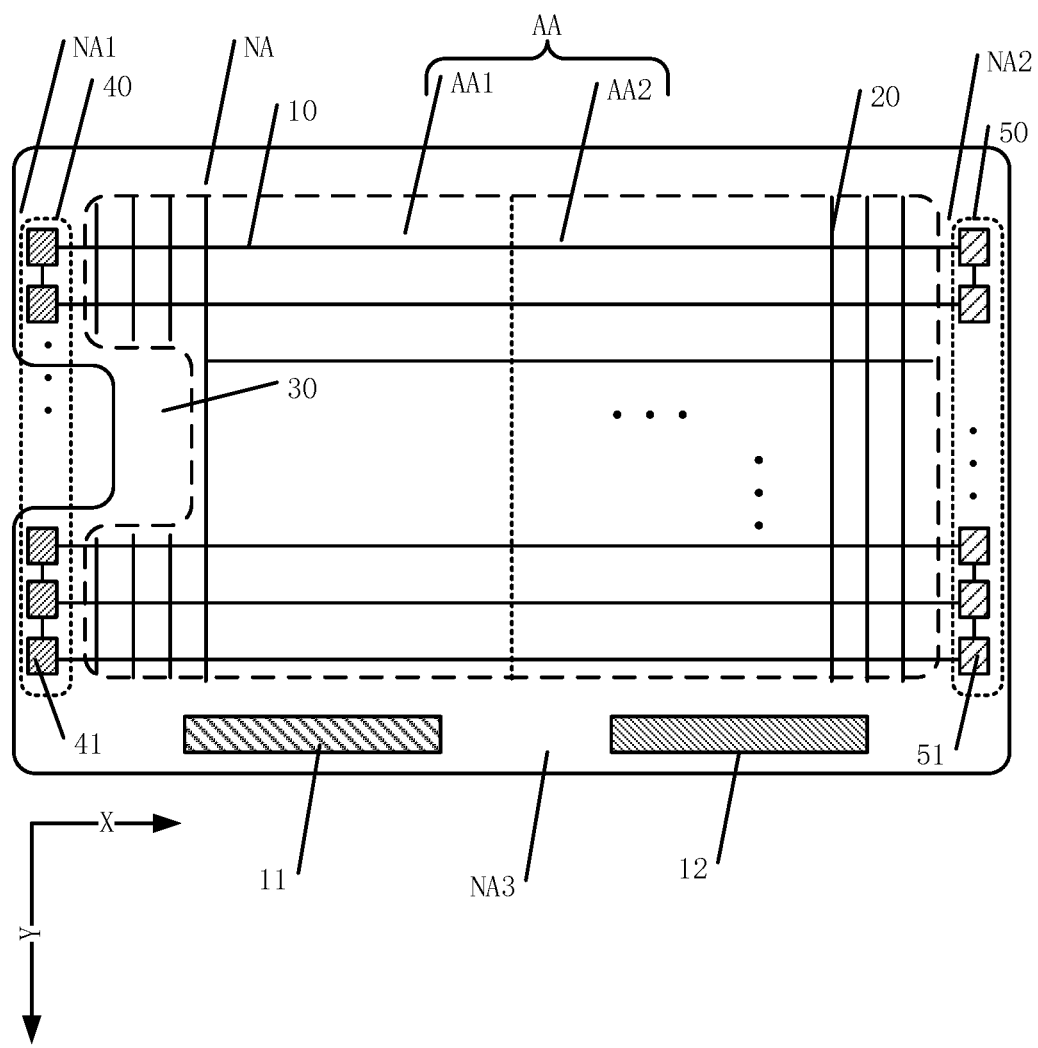
FIG. 1 illustrates a schematic top view of an exemplary display panel consistent with the disclosed embodiments.

The present disclosure provides a display panel. FIG. 1 illustrates a schematic top view of an exemplary display panel consistent with the disclosed embodiments. As shown in FIG. 1, the display panel may include a display area AA and a non-display area NA surrounding the display area AA. The display area AA may include a plurality of signal lines 10 extending in a row direction X, and a plurality of data lines 20 extending in a column direction Y. The display area AA may further include a first display area AA1 and a second display area AA2, both of which are arranged in the row direction X. The first display area AA1 may include at least one notch 30. The non-display area NA may include a first non-display area NA1 and a second non-display area NA2. Along the row direction X, the first non-display area NA1 and the second non-display area NA2 may be respectively disposed at two opposite sides of the display area AA.

The first non-display area NA1 may include a first driving circuit 40, which includes a plurality of cascaded first shift registers 41. The second non-display area NA2 may include a second driving circuit 50, which includes a plurality of cascaded second shift registers 51. The display panel may further include a first driving unit 11 and a second driving unit 12. In the disclosed embodiments, the display area AA may display image information. For example, the display area AA may include a plurality of pixels (not drawn in FIG. 1), while the non-display area NA may not have a display function, for example, the non-display area NA may be disposed with circuits and electronic components.

The display area AA may include the plurality of signal lines 10 extending in the row direction X and the plurality of data lines 20 extending in the column direction Y. It should be noted that, the signal line 10 may be a straight line, or a curved line, or a folded line. For example, the signal line 10 may be configured as a curved line or a folded line to accommodate the arrangement of pixels, as long as the overall extending direction of the signal line 10 is the row direction X. Similarly, the data line 20 may be a straight line, or a curved line, or a folded line, as long as the overall extending direction of the data line 20 is the column direction Y.

The display area AA may be divided into at least two areas: the first display area AA1 and the second display area AA2, and the first display area AA1 and the second display area AA2 may be arranged along the row direction X. In one embodiment, the display panel may be folded, and after the display panel is folded, the first display area AA1 and the second display area AA2 may partially overlap in a direction perpendicular to the first display area AA1, thereby facilitating storage and carry of the display panel.

The first display area AA1 may include at least one notch 30. When the disclosed display panel is applied to the display device of a terminal, the notch 30 may provide a space for various electronic components, thereby meeting the user demands of visual effect. The electronic components may include an optical sensor, an earpiece, a camera, etc., which is not limited by the present disclosure.

FIG. 1 shows the display panel includes one notch 30, which is for illustrative purposes and is not intended to limit the scope of the present disclosure. In certain embodiments, the first display area AA1 may be provided with two or more notches 30. Moreover, FIG. 1 only exemplifies the relative position of the notch 30 in the first display area AA1, which is for illustrative purposes and is not intended to limit the scope of the present disclosure. In practical applications, the relative position of the notch 30 in the first display area AA1 may be determined according to various application scenarios.

In the disclosed embodiments, along the row direction X, the display area AA may be provided with driving circuits on both sides of the display area AA. In particular, the first non-display area NA1 may include the first driving circuit 40, which includes the plurality of cascaded first shift registers 41, and the second non-display area NA2 may include the second driving circuit 50, which includes the plurality of cascaded second shift registers 51. The first drive circuit 40 and the second drive circuit 50 may drive the signal line 10 in various manners. For example, one signal line 10 may only have one end electrically connected to the driving circuit, or may have two ends respectively electrically connected to the first driving circuit 40 and the second driving circuit 50. In addition, the driving manners of the plurality of signal lines 10 may be the same or different, which is not limited by the present disclosure.

Further, the non-display area NA may also include a third non-display area NA3, and the third non-display area NA3 and the display area AA may be arranged along the column direction Y. The third non-display area NA3 may include a first driving unit 11 and a second driving unit 12. The first driving unit 11 and the second driving unit 12 may provide electrical signals for signal wires in the display panel, and may also process electrical signals of signal wires in the display panel.

Because the display area AA is divided into at least two areas, i.e., the first display area AA1 and the second display area AA2, two driving units may be disposed in the third non-display area NA3 accordingly, such that the two driving units may respectively provide electrical signals to certain circuits in the first display area AA1 and certain circuits in the second display area AA2. In one embodiment, the two driving units disposed in the third non-display area NA3 may individually control the first display area AA1 and the second display area AA2, thereby meeting various applications. In one embodiment, both the first driving unit 11 and the second driving unit 12 may be integrated circuits (ICs), and the first driving unit 11 and the second driving unit 12 may be bound to the display panel using conductive adhesive.

In the disclosed embodiments, the display area AA may be divided into at least two areas, for example, the first display area AA1 and the second display area AA2 shown in FIG. 1. The display panel may be flexible. Along a direction perpendicular to the first display area AA1, the first display area AA1 and the second display area AA2 may be partially overlapped, facilitating the storage and carry of the display panel. The first display area AA1 may include at least one notch 30. When the disclosed display panel is applied to the display device of a terminal, the notch 30 may provide a space for accommodating electronic components, thereby satisfying various user demands of visual effect. Moreover, the first driving unit 11 and the second driving unit 12 may be disposed in the display panel, thereby respectively providing electrical signals to certain circuits in the first display area AA1 and certain circuits in the second display area AA2. In one embodiment, the first driving unit 11 and the second driving unit 12 may individually control the first display area AA1 and the second display area AA2, thereby satisfying various application scenarios.

Figure 2:
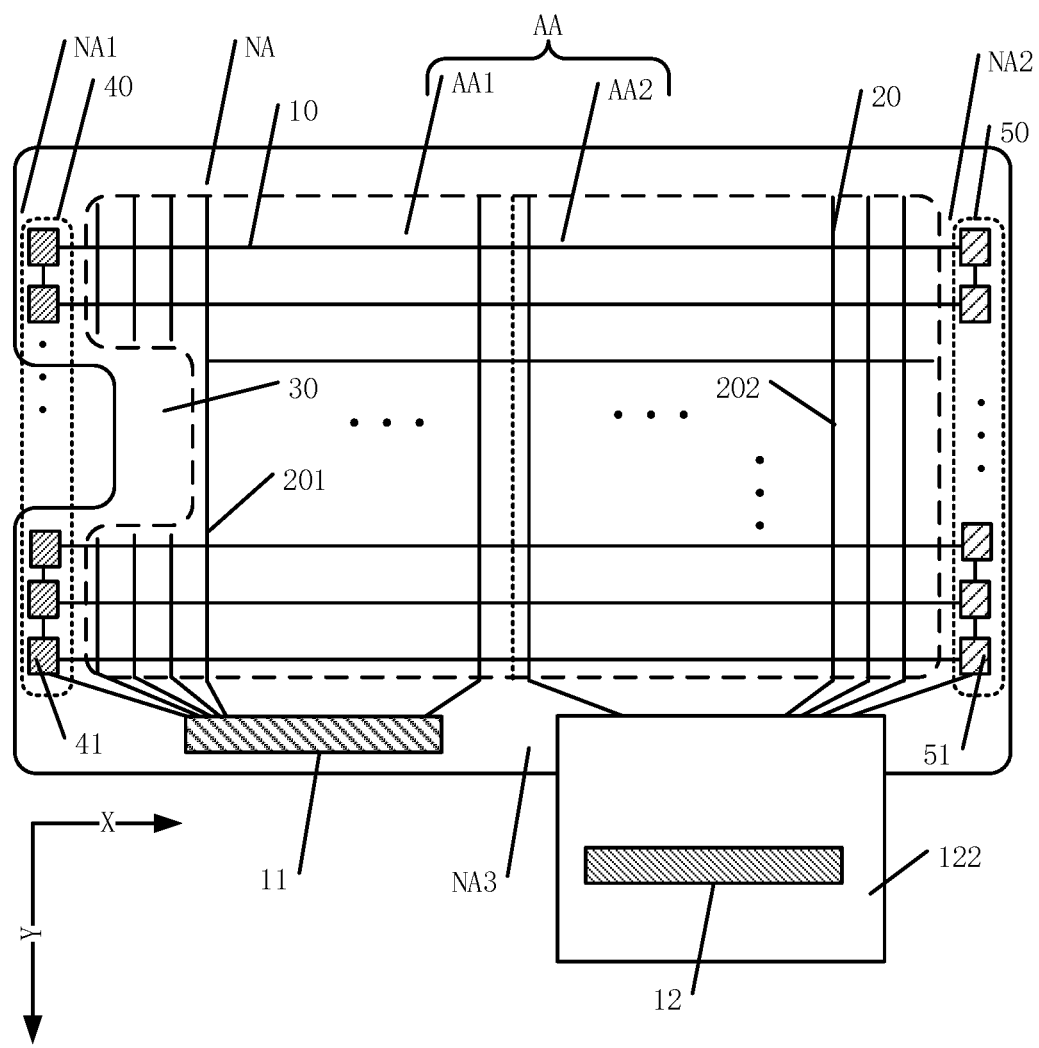
FIG. 2 illustrates a schematic top view of another exemplary display panel consistent with the disclosed embodiments.

FIG. 2 illustrates a schematic top view of another exemplary display panel consistent with the disclosed embodiments. The similarities between FIG. 1 and FIG. 2 are not repeated, while certain differences may be explained.

As shown in FIG. 2, the data line 20 in the first display area AA1 may be a first data line 201, and the data line 20 in the second display area AA2 may be a second data line 202. That is, the plurality of data lines may include at least one first data line 201 disposed in the first display area AA1 and at least one second data line 202 disposed in the second display area AA2. The first driving unit 11 may be electrically connected to the first data line 201 and the first driving circuit 40, and the second driving unit 12 may be electrically connected to the second data line 202 and the second driving circuit 50. The first driving unit 11 may provide electrical signals to the first data line 201 and the first driving circuit 40, and the second driving unit 12 may provide electrical signals to the second data line 202 and the second driving circuit 50. Because the data line controls the voltage of the pixel, the first driving unit 11 and the second driving unit 12 may be able to control the display effect of the first display area AA1 and the second display area AA2, respectively.

For example, in one embodiment, the first driving unit 11 may control the first display area AA1 to display image information, and the second driving unit 12 may control the second display area AA2 to be in a black screen state, i.e., dark state. In another embodiment, the first driving unit 11 may control the first display area AA1 to be in a black screen state, and the second driving unit 12 may control the second display area AA2 to display image information.

In the disclosed embodiments, through configuring the first driving unit 11 and the second driving unit 12, the individual control of the first display area AA1 and the second display area AA2 may be realized, thereby satisfying various application scenarios. Further, the unused display area may be controlled to be in a black screen state, thereby saving power consumption of the display panel and improving the performance of the display panel.

It should be noted that, FIG. 1 shows the first driving unit 11 and the second driving unit 12 are disposed in the third non-display area NA3, which is for illustrative purposes and is not intended to limit the scope of the present disclosure. In one embodiment, the first driving unit 11 and the second driving unit 12 may be bound to the third non-display area NA3 with a conductive adhesive, and the method of binding the driving units is called Chip on Panel (COP). In another embodiment, the first driving unit 11 and the second driving unit 12 may be disposed using a method called Chip on FPC (COF). COF refers to a binding method of binding the driving unit to a flexible printed circuit (FPC) and binding the FPC to the display panel.

Returning to FIG. 2, at least one of the first driving unit 11 and the second driving unit 12 may be disposed in the COF manner. FIG. 2 shows only the second driving unit 12 is bonded to an FPC 122, and the FPC 122 is bound to the third non-display area NA3, which is for illustrative purposes and is not intended to limit the scope of the present disclosure. In practical applications, any one of the first driving unit 11 and the second driving unit 12 may be disposed in the COP or COF manner, which is not limited by the present disclosure.

Figure 3:
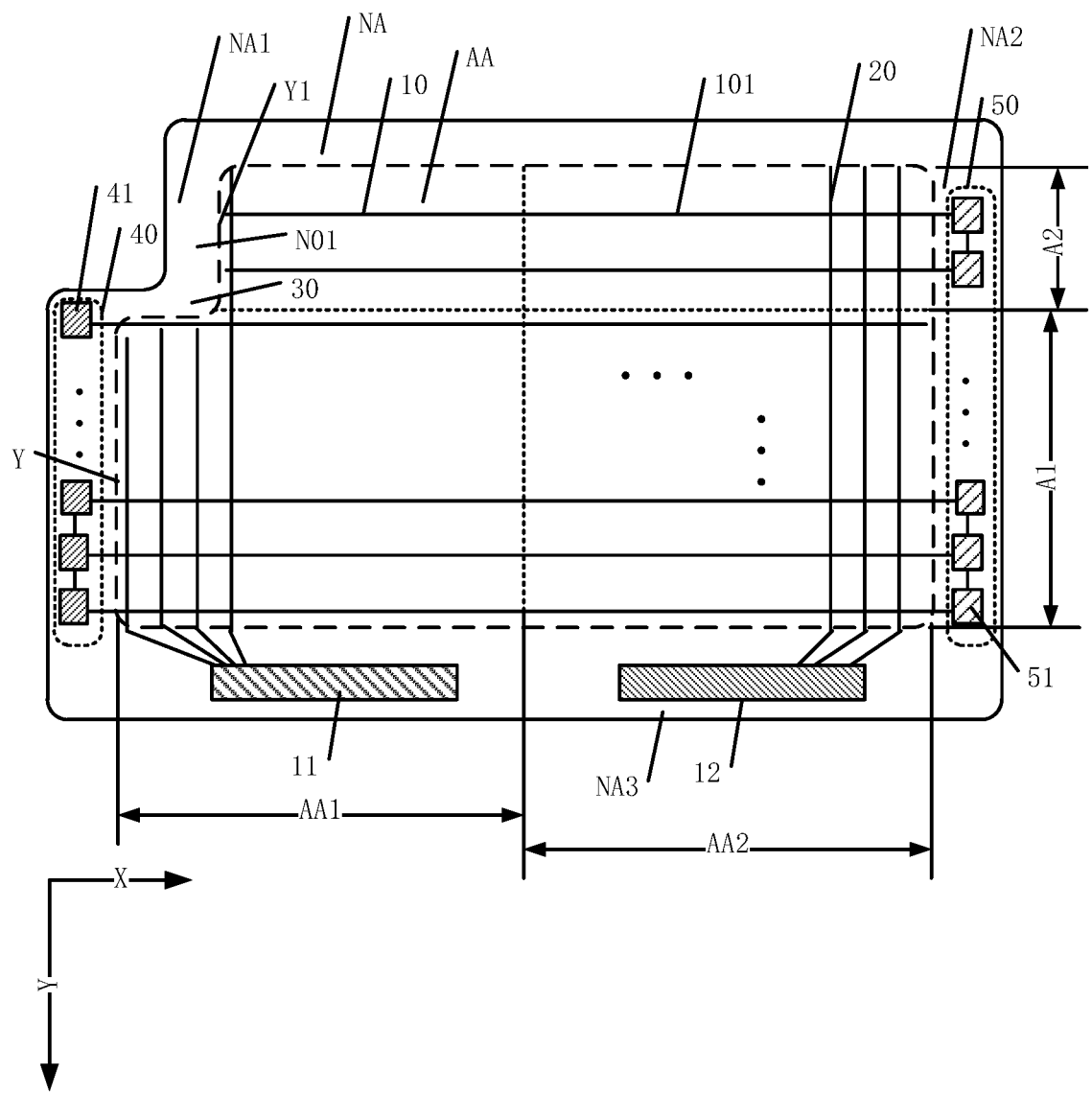
FIG. 3 illustrates a schematic top view of another exemplary display panel consistent with the disclosed embodiments.

FIG. 3 illustrates a schematic top view of another exemplary display panel consistent with the disclosed embodiments. The similarities between FIG. 1 and FIG. 3 are not repeated, while certain differences may be explained.

As shown in FIG. 3, the display area AA may include a regular-shaped area A1 and at least one irregular-shaped area A2. The irregular-shaped area A2 and the notch 30 may be arranged in the row direction X, and the regular-shaped area A1 and the irregular-shaped area A2 may be arranged in the column direction Y. The signal line 10 located in the irregular-shaped area A2 may be an irregular-shaped signal line 101, and the signal line 10 located in the regular-shaped area A1 may be a regular-shaped signal line 102. That is, the plurality of signal lines 10 may include at least one irregular-shaped signal line 101 located in the irregular-shaped area A2 and at least one regular-shaped signal line 102 located in the regular-shaped area A1.

In particular, the irregular-shaped signal line 101 may only have one end electrically connected to the second shift register 51. The regular-shaped signal line 102 may have two ends electrically connected to the first shift register 41 and the second shift register 51, respectively. The first display area AA1 may include an irregular-shaped edge Y, which is a common boundary of the first non-display area NA1 and the first display area AA1. The irregular-shaped edge Y may include at least one sub-edge Y1, which may be recessed toward the inside of the first display area AA1 to form the notch 30.

In FIG. 3, the first display area AA1 may be located between the first non-display area NA1 and the second display area AA2, which is for illustrative purposes and is not intended to limit the scope of the present disclosure. The irregular-shaped signal line 101 in the irregular-shaped area A2 may be single-side driven, i.e., only one end of the irregular-shaped signal line 101 may be electrically connected to the second shift register 51. Because the first display area AA1 is provided with the notch 30, to provide a space for electronic components as much as possible and to improve the display quality, the width of the non-display area at the notch 30 may be desired to be as small as possible. Thus, for the irregular-shaped area A2 arranged at the notch 30, through one-side driving the irregular-shaped signal line 101, the driving circuits may be no longer disposed in the non-display area at the notch 30, thereby reducing the non-display area at the notch 30 and narrowing the frame size of the display panel at the notch 30.

Moreover, the irregular-shaped area A2 and the notch 30 are arranged in the row direction X, the irregular-shaped area A2 may have a length smaller than the regular-shaped area A1 in the row direction X, such that the irregular-shaped signal line 101 may have a length smaller than the regular-shaped signal line 102. Accordingly, the irregular-shaped signal line 101 may have a load smaller than the regular-shaped signal line 102. Further, the irregular-shaped signal line 101 may be single-side driven, and the regular-shaped signal line 102 may be dual-side driven, through which the load difference between the irregular-shaped signal line 101 and the regular-shaped signal line 102 may be reduced, the display uniformity of the regular-shaped area A1 and the irregular-shaped area A2 may be improved, and the display performance may be enhanced.

In the disclosed embodiments, the regular-shaped signal line 102 in the regular-shaped area A1 may be dual-side driven. That is, two ends of the regular-shaped signal line 102 may be electrically connected to the first shift register 41 and the second shift register 51, respectively, and the first shift register 41 and the second shift register 51 may simultaneously supply the same electrical signal to the same regular-shaped signal line 102. By driving the regular-shaped signal line 102 using the dual-side driving mode, the driving signal of the regular-shaped signal line 102 may have an improved uniformity. Especially for a large-sized display panel, the length of the signal lines are often substantially long, when only one end of the signal line is configured to receive the driving signal, a signal delay may occur, and the display performance may be degraded. The disclosed display panel may be able to suppress the signal delay of the regular-shaped signal line 102 and, thus, improve the display performance.

In one embodiment, referring to FIG. 3, in the column direction Y, the irregular-shaped area A2 may have a first side adjacent to the first driving unit 11 and an opposing second side far away from the first driving unit 11, and the regular-shaped area A1 may be disposed at the first side of the irregular-shaped area A2. Further, the first driving unit 11 and the second driving unit 12 may be disposed in the third non-display area NA3, the number of the notches 30 may be one, and the notch 30 may be disposed in a corner of the first display area AA1, in which the corner of the first display area AA1 is located far away from the third non-display area NA3 in the column direction Y. Correspondingly, the number of the regular-shaped area A1 and the irregular-shaped area A2 each may be also one, and the irregular-shaped area A2 may be also disposed on a first side of the regular-shaped area A1, in which the first side of the regular-shaped area A1 is far away from the third non-display zone NA3.

Figure 4:
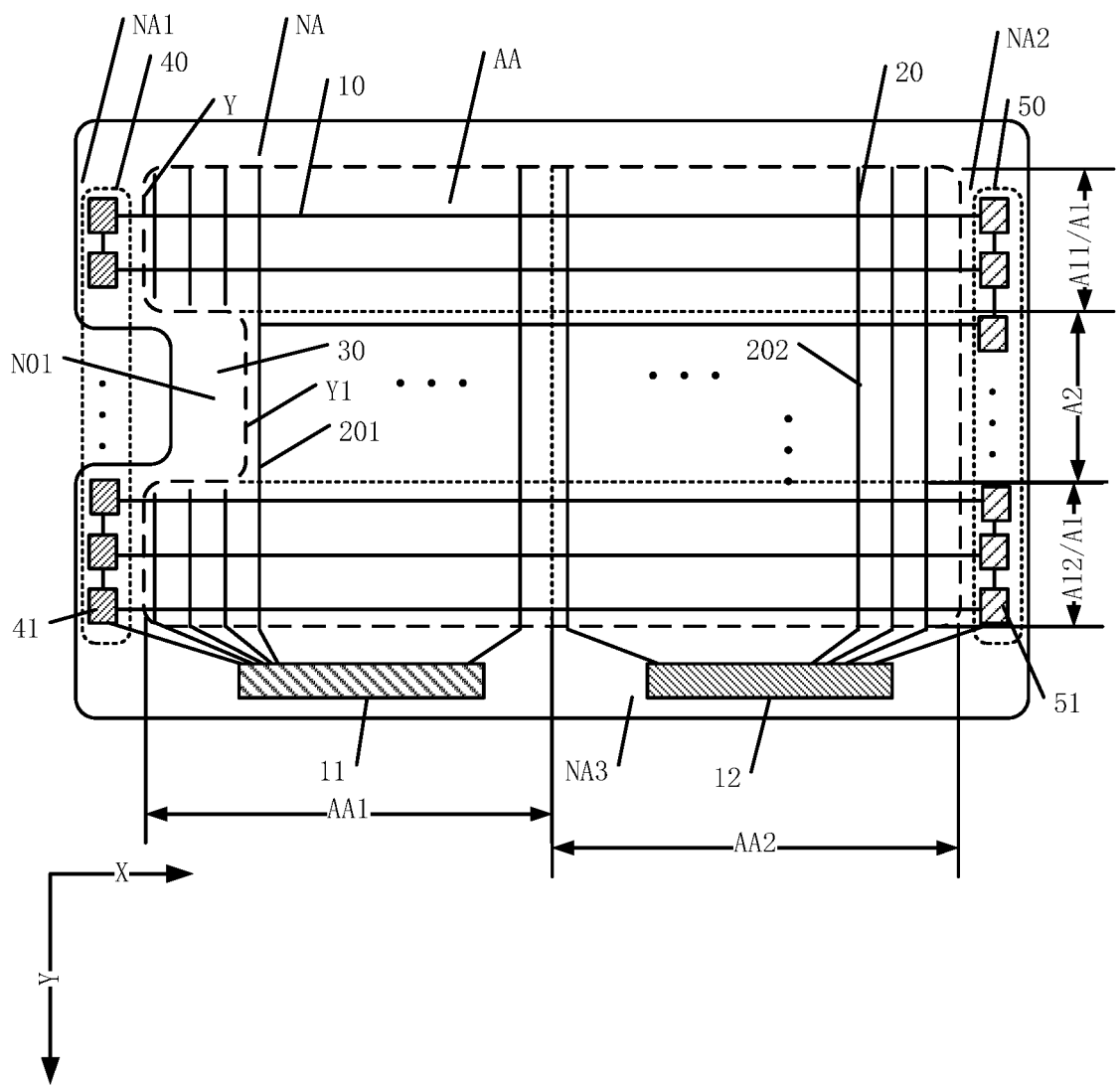
FIG. 4 illustrates a schematic top view of another exemplary display panel consistent with the disclosed embodiments.

FIG. 4 illustrates a schematic top view of another exemplary display panel consistent with the disclosed embodiments. The similarities between FIG. 4 and FIG. 3 are not repeated, while certain differences may be explained. As shown in FIG. 4, the first display area AA1 may include an irregular-shaped edge Y, which may be a common boundary between the first non-display area NA1 and the first display area AA1. The irregular-shaped edge Y may include at least one sub-edge Y1, which may be recessed toward the inside of the first display area AA1 to form the notch 30. The number of the irregular-shaped areas A2 may be at least one, and the irregular-shaped area A2 may be located at a side of the sub-edge Y1, in which the side of the sub-edge Y1 is far away from the first non-display area NA1.

In the disclosed embodiments, the notch 30 may be disposed at a side of the first display area AA1 and, more particular, the common boundary of the first non-display area NA1 and the first display area AA1 may be the irregular-shaped edge Y. The irregular-shaped edge Y may include at least one sub-edge Y1, and the notch 30 may be formed by recessing the at least one sub-edge Y1 towards the inside of the first display area AA1. The display area adjacent to the sub-edge Y1 may be the irregular-shaped area A2, and the number of the irregular-shaped area A2 may be the same as the number of the sub-edges Y1.

It should be noted that, FIG. 4 shows the irregular-shaped edge Y includes one sub-edge Y1, which is for illustrative purposes and is not intended to limit the scope of the present disclosure. In another embodiment, the irregular-shaped edge Y may include two or more sub-edges Y1 and, accordingly, the first display area AA1 may include two or more notches 30. The details are not discussed herein.

In the disclosed embodiments, the notch 30 may be disposed at a side of the first display area AA1. When the disclosed display panel is applied to the display device of a terminal, the notch 30 may provide a space for electronic components to meet the user demands of visual effect. Moreover, when the display panel is flexible and foldable, disposing the notch 30 at the side of the first display area AA1 may fully conform to user's usage habits, thereby improving the user experience.

In certain embodiments, referring to FIG. 3 or FIG. 4, the first non-display area NA1 may include a first sub-area N01, and the first sub-area N01 and the sub-edge Y1 may be disposed adjacent to each other. The first driving circuit 40 may be located in an area other than the first sub-area N01, and the irregular-shaped signal line 101 may only have one end electrically connected to the second shift register 51.

In the disclosed embodiments, the non-display area disposed adjacent to the sub-edge Y1 may be the first sub-area N01. Because the sub-edge Y1 is recessed inwardly to form the notch 30, the wiring and the circuit structure at the notch 30 may be relatively complicated. In the disclosed embodiments, the first sub-circuit N40 may be not disposed in the first sub-area N01, which may simplify the wiring and the circuit structure in the first sub-area N01 and, accordingly, simplify the design of the display panel.

Moreover, the notch 30 may be disposed in the display area, and the notch 30 may provide a space for accommodating the electronic components. A substantially large area of the first sub-area N01 may be not favorable for providing sufficient space for the arrangement of the electronic components. Thus, the first sub-area N01 may be desired to have a substantially small area. In the disclosed embodiments, the first driving circuit 40 may be not disposed in the first sub-area N01, such that the area of the first sub-area N01 may be reduced, and the frame of the first sub-area N01 may be narrowed. Accordingly, more space may be provided to accommodate the electronic components, and the display performance may be enhanced.

Further, the regular-shaped area A1 may include a first regular-shaped area A11 and a second regular-shaped area A12, and along the column direction Y, the first regular-shaped area A11 and the second regular-shaped area A12 may be respectively disposed at two opposite sides of the irregular-shaped area A2. In other words, the notch 30 may be disposed in the middle of the first display area AA, and the irregular-shaped area A2 may be disposed between the first regular-shaped area A11 and the second regular-shaped area A12.

It should be noted that, in the disclosed embodiments, the arrangement of the notch 30 may vary. FIG. 1 to FIG. 4 shows a certain portion of the edge of the first display area AA1 may be inwardly recessed to form the notch 30, which is for illustrative purposes and is not intended to limit the scope of the present disclosure. In the following, other exemplary arrangements of the notch will be described herein.

Figure 5:
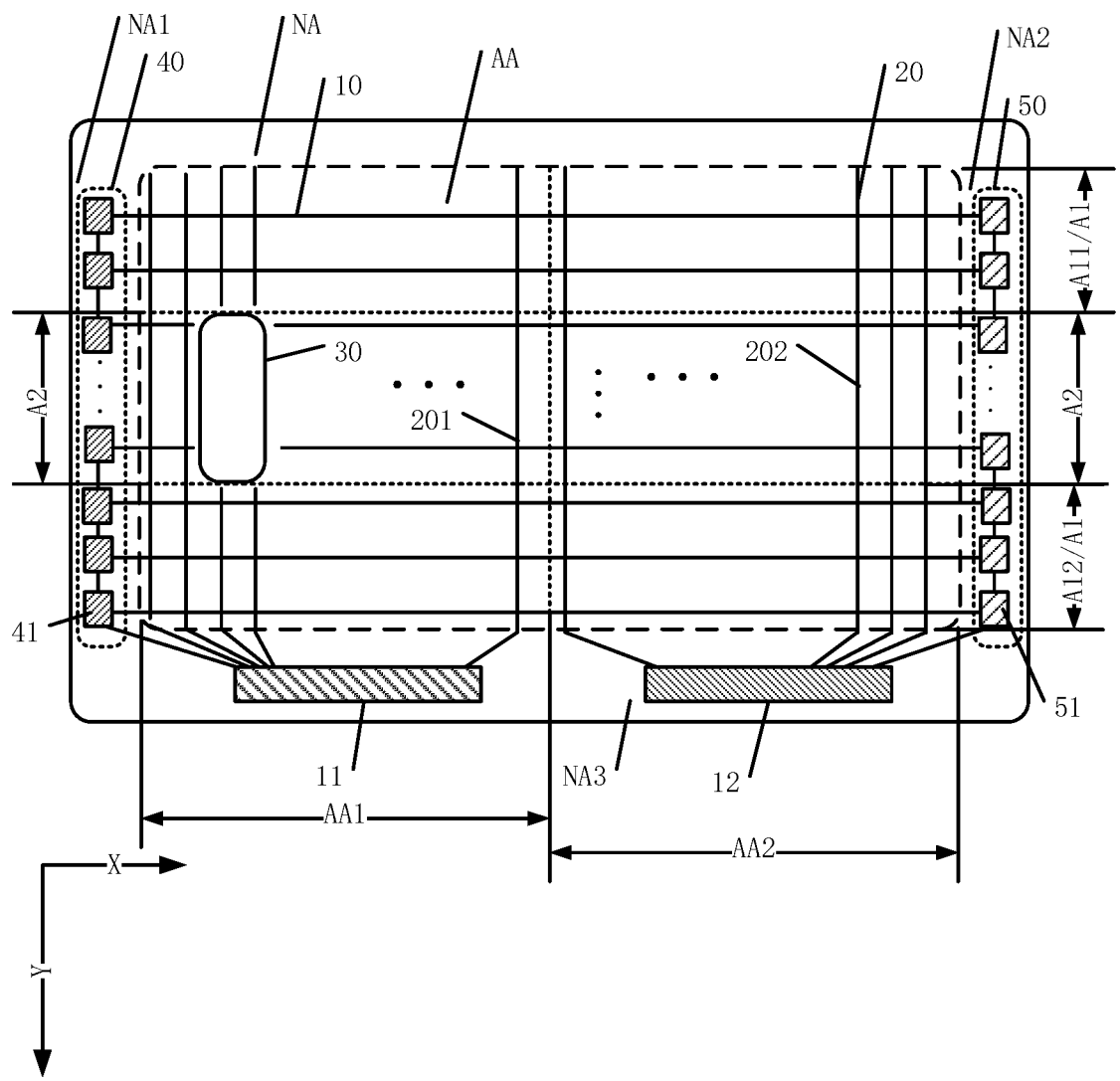
FIG. 5 illustrates a schematic diagram of an exemplary electrostatic discharge circuit consistent with the disclosed embodiments.

FIG. 5 illustrates a schematic diagram of an exemplary electrostatic discharge circuit consistent with the disclosed embodiments. As shown in FIG. 5, the first display area AA1 may be disposed surrounding the notch 30, and along the thickness direction of the display panel, the notch 30 may penetrate the display panel. The number of the irregular-shaped areas A2 may be at least two, and the at least two irregular-shaped areas A2 may be respectively disposed at two opposite sides of the notch 30 in the row direction X.

In one embodiment, as shown in FIG. 5, the number of the notch 30 is one, and the number of the irregular-shaped areas A2 is two. In the row direction X, the two irregular-shaped areas A2 may be respectively disposed at two opposite sides of the notch 30. In another embodiment, the number of the notches 30 may be two and, accordingly, the number of the irregular-shaped areas A2 may be four. In the row direction X, both sides of each notch 30 may be respectively provided with an irregular-shaped area. That is, the number of the irregular-shaped areas A2 may be twice the number of the notches 30.

FIG. 5 shows the shape of the notch 30 may be a rounded rectangle, which is for illustrative purposes and is not intended to limit the scope of the present disclosure. In another embodiment, the notch 30 may have other shapes, such as an ellipse, a circle, a rectangle, and a hexagon, which is not limited by the present disclosure.

In the disclosed embodiments, the notch 30 may be disposed at the first display area AA1, and the area of the notch 30 may be hollowed. When the display panel is applied to the display device of the terminal, the notch 30 may provide a space for accommodating the electronic components. That is, the electronic components may be disposed in the notch 30, thereby realizing a full-screen display and a high integration of the display device.

Further, the regular-shaped area A1 may include a first regular-shaped area A11 and a second regular-shaped area A12. Along the column direction Y, the first regular-shaped area A11 and the second regular-shaped area A12 may be disposed at two opposite sides of the irregular-shaped area A2, respectively. In other words, the notch 30 may be disposed in the middle of the first display area AA, and the irregular-shaped area A2 may be located between the first regular-shaped area A11 and the second regular-shaped area A12.

Figure 6:
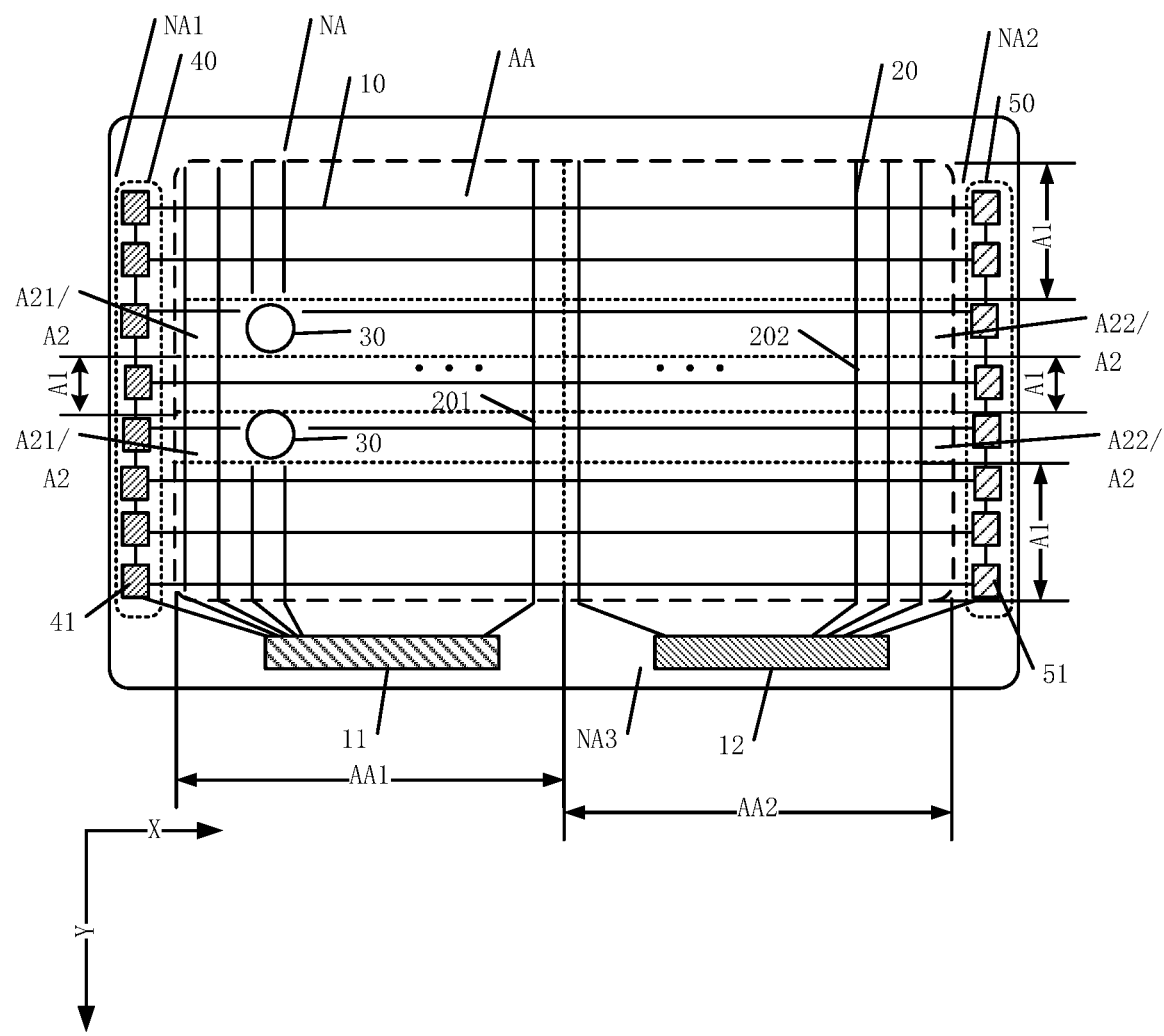
FIG. 6 illustrates a schematic diagram of another exemplary electrostatic discharge circuit consistent with the disclosed embodiments.

FIG. 6 illustrates a schematic diagram of an exemplary electrostatic discharge circuit consistent with the disclosed embodiments. As shown in FIG. 6, the number of the notches 30 may be two, and the two notches 30 may be disposed along the column direction Y. Accordingly, the number of the irregular-shaped areas A2 may be four. In the row direction X, both sides of each notch may be respectively provided with an irregular-shaped area A2.

FIG. 6 shows the shape of the notch 30 is a circle, which is for illustrative purposes and is not intended to limit the scope of the present disclosure. In another embodiment, the notch 30 may have other shapes, such as an ellipse, a circle, a rectangle, and a hexagon, which is not limited by the present disclosure. In addition, the shape and size of the two notches 30 may be the same or different, which is not limited by the present disclosure.

In the disclosed embodiments, the two notches 30 may be arranged in the column direction Y. When the display panel is applied to the display device of a terminal, an electronic component may be disposed in each of the two notches 30, such that the functions of the display device may be further enriched, and a full-screen display and the high integration of the display device may be realized.

Referring to FIG. 6, the irregular-shaped area A2 located at a first side of each notch 30 may be a first irregular-shaped area A21, and the irregular-shaped area A2 located at a second side of each notch 30 may be a second irregular-shaped area A22, in which the first side of the notch 30 may be close to the first non-display area NA1 and the second side of the notch 30 may be close to the second non-display area NA2. That is, the irregular-shaped areas A2 may have a first part located at the first side of each notch 30 and a second part located at the second side of each notch 30, in which the first part may be configured as the first irregular-shaped area A21 and the second part may be configured as the second irregular-shaped area A22. The irregular-shaped signal line 101 in the first irregular-shaped area A21 may only have one end electrically connected to the first shift register 41, and the irregular-shaped signal line 101 in the second irregular-shaped area A22 may only have one end electrically connected to the second shift register 51.

In the display panel shown in FIG. 6, along the column direction Y, the notch 30 may be disposed in the middle of the first display area AA. That is, in the column direction Y, both sides of the notch 30 may be provided with a regular-shaped area A1. In other words, in the column directions Y, one regular-shaped area A1 may be disposed between two notches 30. The regular-shaped signal line 102 in the regular-shaped area A1 may be dual-side driven, in which the regular-shaped signal line 102 may have two ends electrically connected to the first shift register 41 and the second shift register 51, respectively.

In the disclosed embodiments, the irregular-shaped signal lines 101 disposed at two sides of the notch 30 may be respectively driven. That is, the first shift register 41 may drive the irregular-shaped signal line 101 in the first irregular-shaped area A21, and the second shift register 51 may drive the first irregular-shaped signal line 101 in the irregular-shaped area A22, thereby enabling the irregular-shaped signal lines 101 disposed at two sides of the notch 30 to receive the driving signal. Moreover, the irregular-shaped signal lines 101 disposed at two sides of the notch 30 may not have to be electrically connected, such that the wiring structure around the notch 30 may be reduced, the area ratio of the display area AA may be increased, and the display performance may be enhanced.

Figure 7:
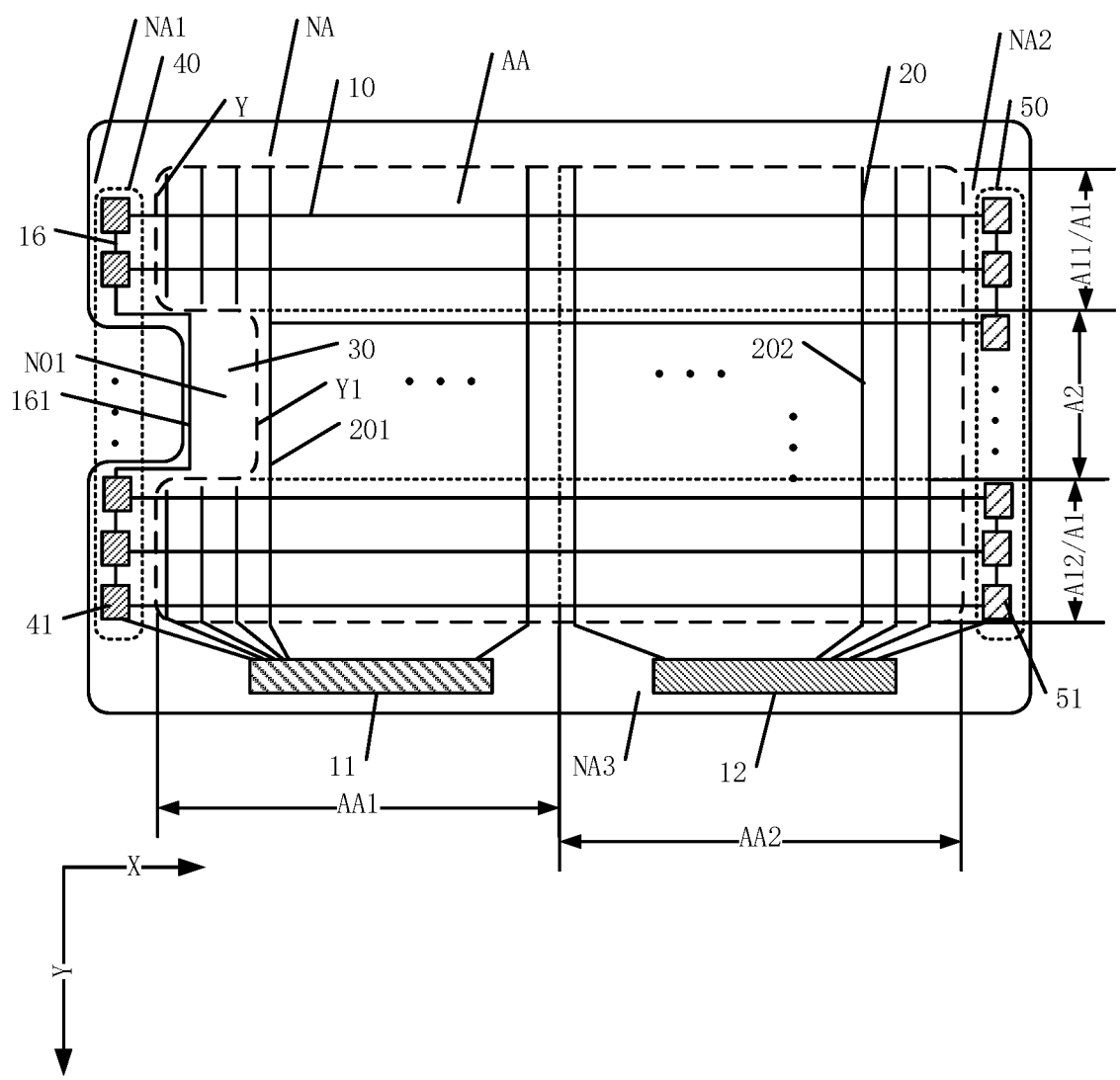
FIG. 7 illustrates a schematic diagram of another exemplary electrostatic discharge circuit consistent with the disclosed embodiments.

FIG. 7 illustrates a schematic diagram of an exemplary electrostatic discharge circuit consistent with the disclosed embodiments. As shown in FIG. 7, the first driving circuit 40 may include a plurality of connecting lines 16, which may be configured to realize the cascaded connection of the plurality of first shift registers 41. The plurality of connecting lines 16 may include at least one first connecting line 161, and a part of the first connecting line 161 may be located in the first sub-area N01. In the disclosed embodiments, the plurality of first shift registers 41 may be cascaded connected by the connecting line 16. It should be noted that, the cascade connection of the shift registers may be realized in different manners, and the present disclosure does not limit the manner of the cascade connection of the first shift registers 41 in the first driving circuit 40.

The first driving circuit 40 may be located in a region other than the first sub-region N01 and, thus, the plurality of first shift registers 41 may be divided into two parts, which may be respectively disposed at two sides of the notch 30 in the column direction Y. The at least one first connecting line 161 may be configured to realize the cascaded connection between the two parts of the first shift register 41. The first connecting line 161 may extend through the first sub-area N01. Because the number of the first connecting lines 161 is often small, the area occupied by the first sub-area N01 may be substantially small, which is not likely to have a substantial influence on the width of the first sub-area N01.

It should be noted that, the specific number of the first connecting lines 161 may be determined according to the cascading manner of the first shift registers. FIG. 7 shows the number of the first connecting lines 161 is one, which is for illustrative purposes and is not intended to limit the scope of the present disclosure.

In the display panel shown in FIG. 3 to FIG. 7, the irregular-shaped signal lines may be single-side driven, and the regular-shaped signal line may be dual-side driven, which is for illustrative purposes and is not intended to limit the scope of the present disclosure. In certain embodiments, the irregular-shaped signal lines and the regular-shaped signal line may be all dual-side driven. A corresponding structure is shown in FIG. 8.

Figure 8:
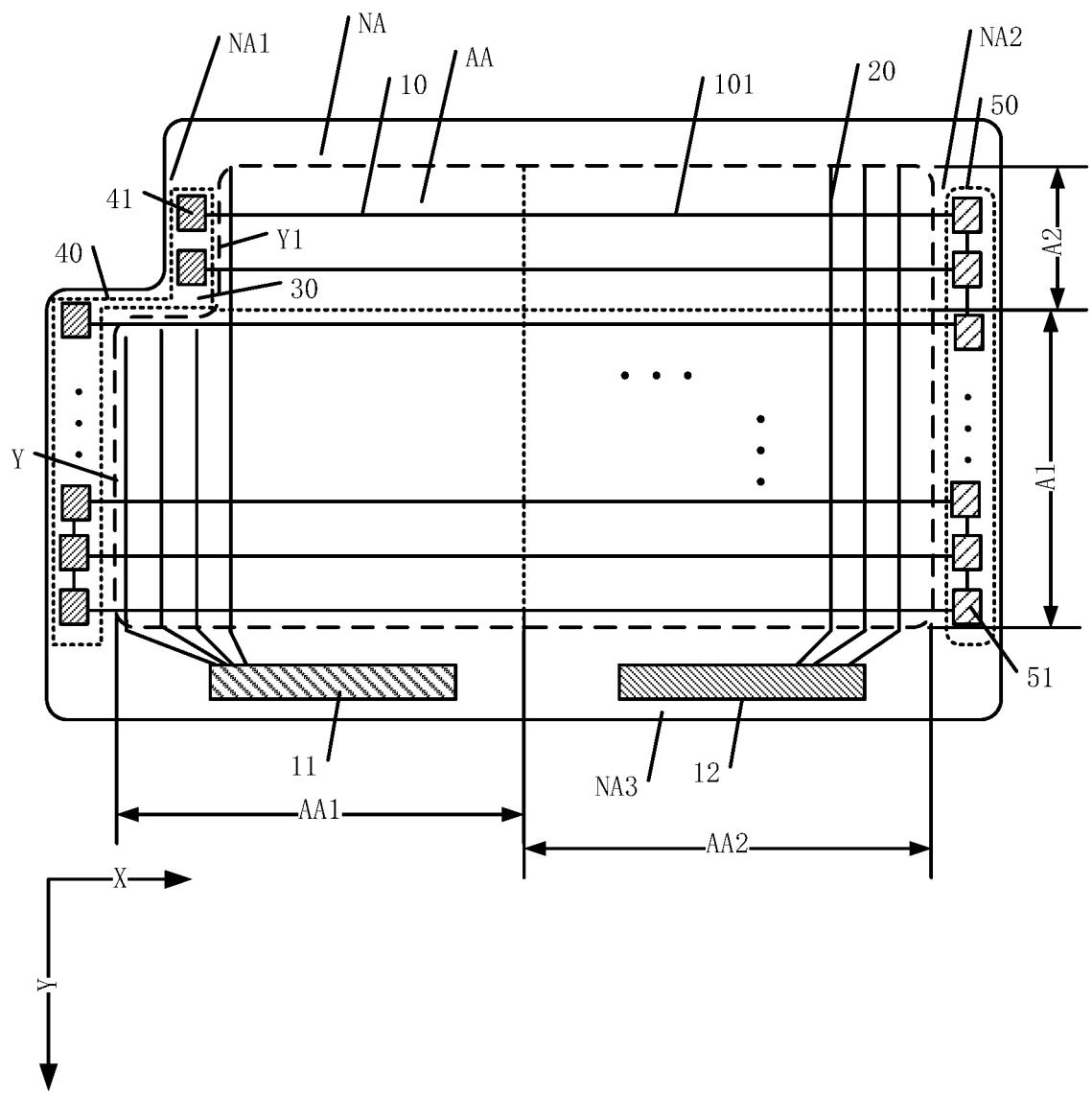
FIG. 8 illustrates a schematic diagram of another exemplary electrostatic discharge circuit consistent with the disclosed embodiments.

FIG. 8 illustrates a schematic diagram of an exemplary electrostatic discharge circuit consistent with the disclosed embodiments. As shown in FIG. 8, the display area AA may include a regular-shaped area A1, at least one irregular-shaped area A2. The regular-shaped area A1 and the irregular-shaped area A2 may be arranged along the column direction Y. The irregular-shaped area A2 and the notch 30 may be arranged along the row direction X. The signal line 10 located in the irregular-shaped area A2 may be an irregular-shaped signal line 101, and the signal line 10 located in the regular-shaped area A1 may be a regular-shaped signal line 102. That is, the plurality of signal lines 10 may include at least one irregular-shaped signal line 101 located in the irregular-shaped area A2 and at least one regular-shaped signal line 102 located in the regular-shaped area A1. The irregular-shaped signal line 101 may have two ends electrically connected to the first shift register 41 and the second shift register 51, respectively. The regular-shaped signal line 102 may have two ends electrically connected to the first shift register 41 and the second shift register 51, respectively.

In the disclosed embodiments, the irregular-shaped signal line 101 and the regular-shaped signal line 102 each may be dual-side driven, i.e., the signal lines 10 in the display area AA may be all dual-side driven. When the irregular-shaped signal line 101 and the regular-shaped signal line 102 have a substantially small length difference, the load of the irregular-shaped signal line 101 and the regular-shaped signal line 102 may substantially remain the same. Accordingly, through driving the irregular-shaped signal line 101 and the regular-shaped signal line 102 in a same driving mode, the display uniformity of the regular-shaped area A1 and the irregular-shaped area A2 may be improved, and the display performance may be enhanced.

It should be noted that, FIG. 8 shows the notch 30 is formed by recessing only the edge of the first display area AA1, which is for illustrative purposes and is not intended to limit the scope of the present disclosure. In certain embodiments, the first display area AA1 may be disposed surrounding the notch 30, along the thickness direction of the display panel, the notch 30 may penetrate the display panel, and the irregular-shaped signal line 101 and the regular-shaped signal line 102 may be dual-side driven. Similarly, the display uniformity of the regular-shaped area A1 and the irregular-shaped area A2 may be improved. The details are not explained herein.

In the disclosed embodiments, the signal line 10 may be a gate line or a light-emitting control line, as shown in FIG. 1 to FIG. 8. In one embodiment, the signal line 10 may be a gate line, each of the first driving circuit 40 and the second driving circuit 50 may be electrically connected to a plurality of gate lines, and both the first driving circuit 40 and the second driving circuit 50 may be gate driving circuits for providing gate driving signals to the plurality of gate lines.

In another embodiment, the signal line 10 may be a light-emitting control line, each of the first drive circuit 40 and the second drive circuit 50 may be electrically connected to a plurality of light-emitting control lines. Both the first driving circuit 40 and the second driving circuit 50 may be lighting control circuits for providing lighting control signals to the plurality of light-emitting control lines. Generally, the display panel displays images through a plurality of pixels (not illustrated in FIGS. 1-8). Each pixel may include a pixel driving circuit, and the light-emitting control line may be electrically connected to the pixel driving circuit, and the duration of light-emitting of the pixel may be controlled by an electrical signal of the corresponding light-emitting control line.

Figure 9:
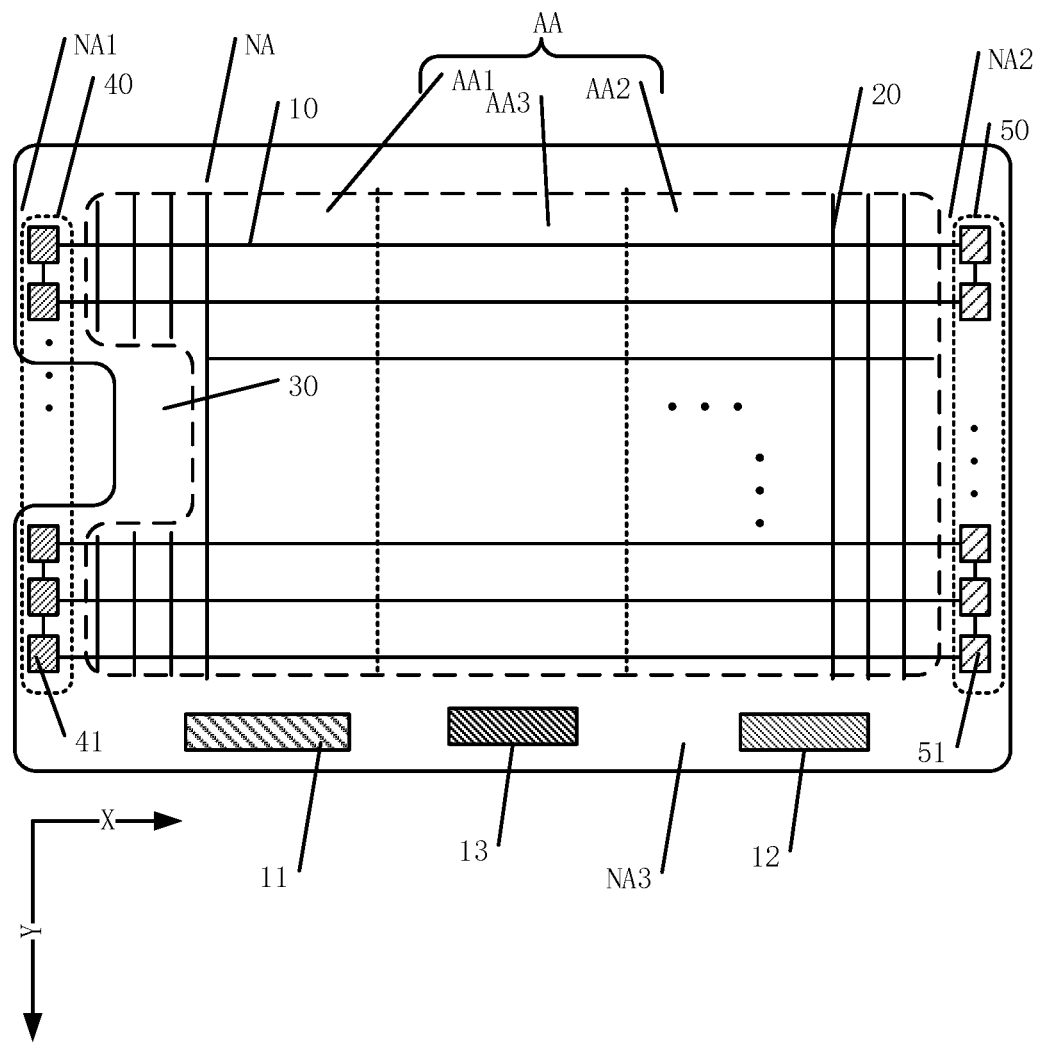
FIG. 9 illustrates a schematic top view of another exemplary display panel consistent with the disclosed embodiments.

FIG. 9 illustrates a schematic top view of another exemplary display panel consistent with the disclosed embodiments. As shown in FIG. 9, the third non-display area NA3 may include at least one third driving unit 13, which may be located between the first driving unit 11 and the second driving unit 12. The display area AA may include a third display area AA3, which may be located between the first display area AA1 and the second display area AA2. In one embodiment, the third driving unit 13 may be an integrated circuit (IC), and the third driving unit 13 and the third display area AA3 may be electrically connected to each other to control the display state of the third display area AA3.

It should be noted that, FIG. 9 shows the number of the third driving units 13 is one, which is for illustrative purposes and is not intended to limit the scope of the present disclosure. In another embodiment, the number of the third driving units 13 may be two or more, which is not limited by the present disclosure. Further, the number of the third driving units 13 may be determined according to various application scenarios. Through configuring different driving units to respectively control different areas of the display area AA, the application scenarios of the display device may be enriched, and the user experience may be improved.

Figure 10:
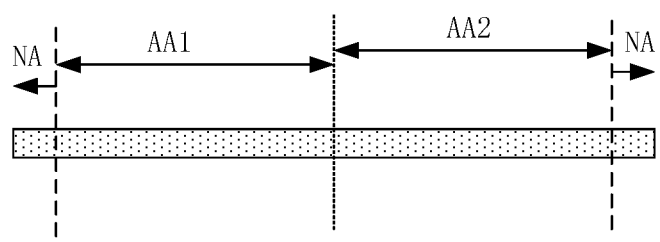
FIG. 10 illustrates a schematic cross-sectional view of another exemplary display panel consistent with the disclosed embodiments.
Figure 11:
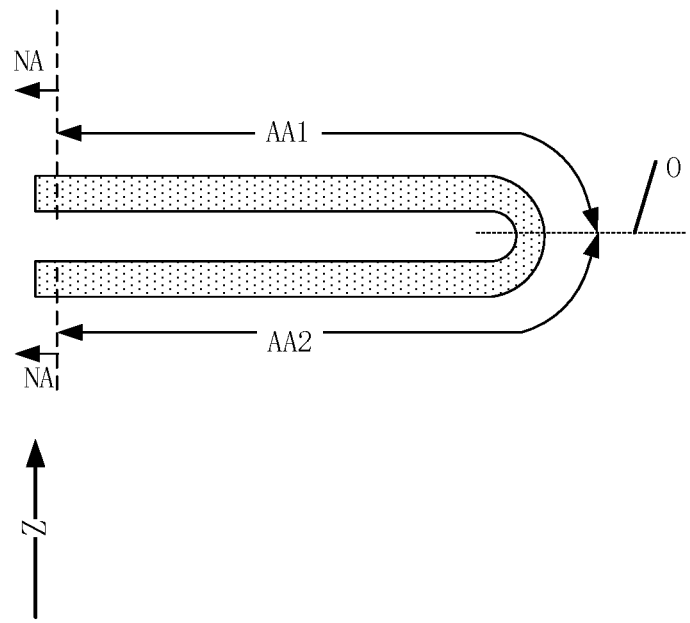
FIG. 11 illustrates a schematic cross-sectional view of another exemplary display panel consistent with the disclosed embodiments.

In one embodiment, the disclosed display panel may include two states: a flat state and a bent state. FIG. 10 illustrates a schematic cross-sectional view of another exemplary display panel consistent with the disclosed embodiments, and FIG. 11 illustrates a schematic cross-sectional view of another exemplary display panel consistent with the disclosed embodiments. As shown in FIG. 10, in a flat state, the first display area AA1 and the second display area AA2 may be arranged on the same plane. As shown in FIG. 11, in a bent state, in a direction perpendicular to the first display area AA1, the display panel may be bent along a bending line O. The first display area AA1 and the second display area AA2 may be at least partially overlapped with each other in the direction perpendicular to the first display area AA1, in which the bending line O may form the boundary between the first display area AA1 and the second display area AA2. In FIG. 11, the direction perpendicular to the first display area AA1 is a Z direction.

In the disclosed embodiments, the display panel may be a bendable display panel. In particular, the display panel may be made of a flexible material. When the display panel is in the flat state, a full-screen display may be realized, and when the display panel is in the bent state, the display panel may be convenient for storage and carry, thereby improving the user experience.

The present disclosure further provides a display device, including any one of the disclosed display panels and a housing for accommodating the display panel.

Figure 12:
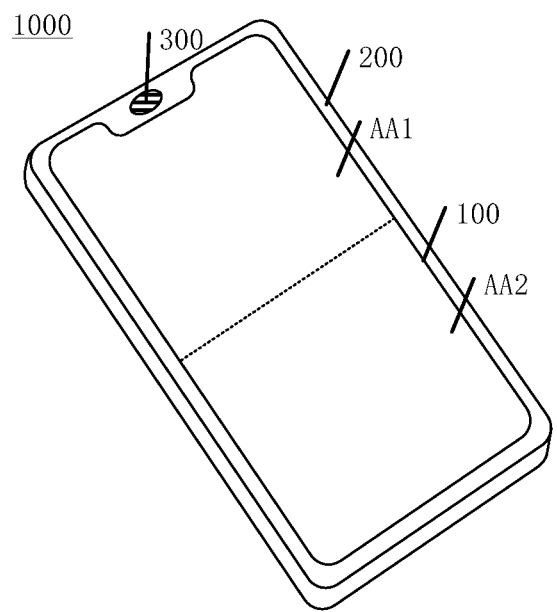
FIG. 12 illustrates a schematic top view of an exemplary display device consistent with the disclosed embodiments.
Figure 13:
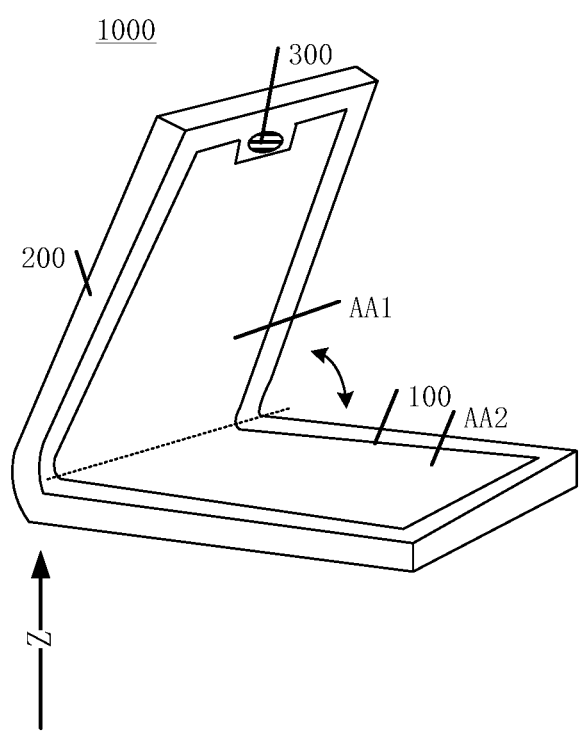
FIG. 13 illustrates a schematic top view of another exemplary display device consistent with the disclosed embodiments.

FIG. 12 illustrates a schematic top view of an exemplary display device 1000 consistent with the disclosed embodiments, and FIG. 13 illustrates a schematic top view of another exemplary display device 1000 consistent with the disclosed embodiments.

As shown in FIG. 12, the display device 1000 may include a display panel 100 and a housing 200 for accommodating the display panel 100. The display panel 100 may be any one of the disclosed display panels. In one embodiment, the display device may further include an electronic component 300 which is disposed at the position of the notch of the display panel. The electronic component 300 may be an optical sensor, a camera, an earpiece, etc., which is not limited by the present disclosure.

FIG. 12 shows the display device 1000 may be a mobile phone, which is for illustrative purposes and is not intended to limit the scope of the present disclosure. The display device 1000 may also be any display device with a display function such as a laptop, a television, a tablet, and a wearable device, etc., which is not limited by the present discourse. Because the disclosed display device includes any one of the disclosed display panels, the disclosed display device may also have the same features as the disclosed display panel, and details are not described herein again.

In one embodiment, the display device 1000 may have two states: a first state and a second state. Referring to FIG. 12, in the first state, the housing 200 may be unfolded, such that the first display area AA1 and the second display area AA2 may be arranged on the same plane. Referring to FIG. 13, in the second state, in a direction perpendicular to the first display area AA1, the housing 200 may be folded such that the first display area AA1 and the second display area AA2 may at least partially overlap with each other. The direction perpendicular to the first display area AA1 is a Z direction.

In the disclosed embodiments, the display device may include a flexible display panel. In particular, the housing 200 of the display device may be made of a flexible material. When the display device is in the first state, i.e., a flat state, the user may be provided with a full screen display effect. When the display device is in the second state, i.e., a bent state, the display device may be convenient for storage and carry, thereby improving the user experience.

In the disclosed embodiments, the display area may be divided into at least two areas, the first display area and the second display area. The display panel may be flexible, and after being folded, along a direction perpendicular to the first display area, the first display area and the second display area may be partially overlapped, facilitating the storage and carry of the display panel. The first display area may include at least one notch. When the disclosed display panel is applied to the display device of a terminal, the notch may provide a space for electronic components, thereby satisfying various user demands of visual effect. Moreover, the first driving unit and the second driving unit may be disposed in the display panel, thereby respectively providing electrical signals to certain circuits in the first display area and certain circuits in the second display area. In one embodiment, the first driving unit and the second driving unit may individually control the first display area and the second display area, respectively, thereby satisfying various application scenarios.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
    a display area including a plurality of signal lines extending in a row direction and a plurality of data lines extending in a column direction, wherein the display area includes a first display area and a second display area, the first display area and the second display area are arranged in the row direction, and the first display area includes at least one notch; and
    a non-display area surrounding the display area, wherein the non-display area includes a first non-display area and a second non-display area, and along the row direction, the first non-display area and the second non-display area are respectively disposed at two opposite sides of the display area,
    wherein the first non-display area includes a first driving circuit, which includes a plurality of cascaded first shift registers,
    the second non-display area includes a second driving circuit, which includes a plurality of cascaded second shift registers, and
    the display panel includes a first driving unit and a second driving unit configured to individually control the first display area and the second display area, such that, when not in use, the first display area or the second display area is controlled to be in a black screen state to save power consumption of the display panel,
    wherein the first display area and the second display area are foldable in the row direction along a bending line, such that the display area is capable of being switched between a first state, where the first display area and the second display area are arranged on a same plane, and a second state, where the first display area and the second display area are at least partially overlapped with each other, and
    wherein at least one of the first driving circuit and the second driving circuit is a flexible printed circuit bonded to the display panel.

2. The display panel according to claim 1, wherein:
    the plurality of data lines include at least one first data line disposed in the first display area and at least one second data line disposed in the second display area;
    the first driving unit is electrically connected to the at least one first data line and the first driving circuit; and the second driving unit is electrically connected to the at least one second data line and the second driving circuit.

3. The display panel according to claim 1, wherein:
the display area includes a regular-shaped area and at least one irregular-shaped area,
wherein the at least one irregular-shaped area and the at least one notch are arranged in the row direction, and the regular-shaped area and the at least one irregular-shaped area are arranged in the column direction,
the plurality of signal lines include at least one irregular-shaped signal line disposed in the at least one irregular-shaped area and at least one regular-shaped signal line disposed in the regular-shaped area,
the at least one irregular-shaped signal line has only one end electrically connected to a second shift register or a first shift register, and
the at least one regular-shaped signal line has two ends electrically connected to a first shift register and a second shift register, respectively.

4. The display panel according to claim 3, wherein:
the first display area includes an irregular-shaped edge,
wherein the irregular-shaped edge is a common boundary of the first non-display area and the first display area,
the irregular-shaped edge includes at least one sub-edge, and the at least one sub-edge is recessed toward an inside of the first display area to form the at least one notch, and
the at least one irregular-shaped area is located at a side of the at least one sub-edge, in which the side of the at least one sub-edge is far away from the first non-display area.

5. The display panel according to claim 4, wherein:
the first non-display area includes a first sub-area, wherein the first sub-area and the sub-edge are disposed adjacent to each other;
the first driving circuit is disposed in an area other than the first sub-area; and
the at least one irregular-shaped signal line has only one end electrically connected to the second shift register.

6. The display panel according to claim 5, wherein:
the first driving circuit includes a plurality of connecting lines,
wherein the plurality of connecting lines are configured to realize a cascaded connection of the plurality of cascaded first shift registers,
the plurality of connecting lines include at least one first connecting line, and
the at least one first connecting line is partially located in the first sub-area.

7. The display panel according to claim 4, wherein:
the regular-shaped area includes a first regular-shaped area and a second regular-shaped area; and
along the column direction, the first regular-shaped area and the second regular-shaped area are respectively disposed at two opposite sides of the at least one irregular-shaped area.

8. The display panel according to claim 4, wherein:
the at least one irregular-shaped area has a first side adjacent to the first driving unit and an opposing second side far away from the first driving unit, and
the regular-shaped area is disposed at the first side of the at least one irregular-shaped area.

9. The display panel according to claim 3, wherein:
the first display area is disposed surrounding the at least one notch, and along a thickness direction of the display panel, the at least one notch penetrates the display panel;
the display area includes at least two irregular-shaped areas; and
in the row direction, the at least two irregular-shaped areas are respectively disposed at two opposite sides of the at least one notch.

10. The display panel according to claim 9, wherein:
the at least two irregular-shaped areas have a first part and a second part located at a first side and a second side of the at least one notch, respectively,
wherein the first part and the second part are configured as a first irregular-shaped area and a second irregular-shaped area, respectively,
the first side of the at least one notch is close to the first non-display area and the second side of the at least one notch is close to the second non-display area,
the at least one irregular-shaped signal line disposed in the first irregular-shaped area has only one end electrically connected to the first shift register, and
the at least one irregular-shaped signal line disposed in the second irregular-shaped area has only one end electrically connected to the second shift register.

11. The display panel according to claim 9, wherein:
the regular-shaped area includes a first regular-shaped area and a second regular-shaped area; and
along the column direction, the first regular-shaped area and the second regular-shaped area are respectively disposed at two opposite sides of the at least two irregular-shaped areas.

12. The display panel according to claim 9, wherein:
the display panel includes two notches arranged along the column direction.

13. The display panel according to claim 9, wherein:
the at least one notch has a shape of an ellipse, a circle, a rectangle or a rounded rectangle.

14. The display panel according to claim 1, wherein:
the display area includes a regular-shaped area and at least one irregular-shaped area,
wherein the regular-shaped area and the at least one irregular-shaped area are arranged along the column direction,
the plurality of signal lines include at least one irregular-shaped signal line disposed in the at least one irregular-shaped area and at least one regular-shaped signal line located in the regular-shaped area,
the at least one irregular-shaped signal line has two ends electrically connected to a first shift register and a second shift register, respectively, and
the at least one regular-shaped signal line has two ends electrically connected to a first shift register and a second shift register, respectively.

15. The display panel according to claim 1, wherein:
the plurality of signal lines are a plurality of gate lines; and
each of the first driving circuit and the second driving circuit are electrically connected to the plurality of gate lines.

16. The display panel according to claim 1, wherein:
the plurality of signal lines are a plurality of light-emitting control lines; and
each of the first driving circuit and the second driving circuit are electrically connected to the plurality of light-emitting control lines.

17. The display panel according to claim 1, further comprising:
- at least one third driving unit disposed between the first driving unit and the second driving unit.

18. The display panel according to claim 1, wherein:
- has the first state is a flat state, and the second state is a bent state,
- in the bent state, in a direction perpendicular to the first display area, the display panel is folded along the bending line, and the bending line forms a boundary between the first display area and the second display area.

19. A display device, comprising:
- a display panel; and
- a housing for accommodating the display panel,
- wherein the display panel comprises:
  - a display area including a plurality of signal lines extending in a row direction and a plurality of data lines extending in a column direction, wherein the display area includes a first display area and a second display area, the first display area and the second display area are arranged in the row direction, and the first display area includes at least one notch; and
  - a non-display area surrounding the display area, wherein the non-display area includes a first non-display area and a second non-display area, and along the row direction, the first non-display area and the second non-display area are respectively disposed at two opposite sides of the display area,
- wherein the first non-display area includes a first driving circuit, which includes a plurality of cascaded first shift registers,
- the second non-display area includes a second driving circuit, which includes a plurality of cascaded second shift registers, and
- the display panel includes a first driving unit and a second driving unit configured to individually control the first display area and the second display area, such that, when not in use, the first display area or the second display area is controlled to be in a black screen state to save power consumption of the display panel,
- wherein the first display area and the second display area are foldable in the row direction along a folding line, such that the display area is capable of being switched between a first state, where the first display area and the second display area are arranged on a same plane, and a second state, where the first display area and the second display area are at least partially overlapped with each other, and
- wherein at least one of the first driving circuit and the second driving circuit is a flexible printed circuit bonded to the display panel.

\* \* \* \* \*